United States Patent
Rogojina et al.

(10) Patent No.: US 9,966,479 B2
(45) Date of Patent: May 8, 2018

(54) ALUMINUM-TIN PASTE AND ITS USE IN MANUFACTURING SOLDERABLE ELECTRICAL CONDUCTORS

(71) Applicant: E I DU PONT DE NEMOURS AND COMPANY, Wilmington, DE (US)

(72) Inventors: Elena V Rogojina, San Jose, CA (US); Gonghou Wang, Foster City, CA (US); Elizabeth Tai, Cupertino, CA (US); Maxim Kelman, Mountain View, CA (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 374 days.

(21) Appl. No.: 14/715,113

(22) Filed: May 18, 2015

(65) Prior Publication Data
US 2015/0364615 A1    Dec. 17, 2015

Related U.S. Application Data

(60) Provisional application No. 62/011,108, filed on Jun. 12, 2014.

(51) Int. Cl.
| | |
|---|---|
| *H01L 31/042* | (2014.01) |
| *H01L 31/0224* | (2006.01) |
| *H01B 1/02* | (2006.01) |
| *B23K 35/02* | (2006.01) |
| *B23K 35/26* | (2006.01) |
| *B23K 35/28* | (2006.01) |
| *C22C 13/00* | (2006.01) |
| *C22C 21/00* | (2006.01) |

(52) U.S. Cl.
CPC ........ *H01L 31/0224* (2013.01); *B23K 35/025* (2013.01); *B23K 35/262* (2013.01); *B23K 35/288* (2013.01); *C22C 13/00* (2013.01); *C22C 21/003* (2013.01); *H01B 1/023* (2013.01)

(58) Field of Classification Search
CPC ................................ H01L 21/28; C03C 3/062
USPC .................................................. 136/244, 256
See application file for complete search history.

(56) References Cited

U.S. PATENT DOCUMENTS

| | | | |
|---|---|---|---|
| 2009/0101190 A1* | 4/2009 | Salami | C03C 3/062 136/244 |
| 2009/0288709 A1 | 11/2009 | Ilda et al. | |
| 2013/0265735 A1 | 10/2013 | Nakatani et al. | |

FOREIGN PATENT DOCUMENTS

| | | | | |
|---|---|---|---|---|
| JP | S60140883 | * | 7/1985 | ............. H01L 21/28 |
| WO | 2013032716 A1 | | 3/2013 | |

OTHER PUBLICATIONS

International Search Report dated Dec. 14, 2015 for International Patent Application No. PCT/US2015/035480.

* cited by examiner

*Primary Examiner* — Khanh Tuan Nguyen

(57) ABSTRACT

The present invention is directed to a paste composition comprising Al and Sn dispersed in an organic medium and to paste compositions that provide a solderable electrode. The present invention is further directed to an electrode formed from the paste composition and a semiconductor device and, in particular, a solar cell comprising such an electrode. The paste compositions that provide a solderable electrode are particularly useful for forming a solar cell back side solderable electrode.

10 Claims, 2 Drawing Sheets

ALUMINUM-TIN PASTE AND ITS USE IN MANUFACTURING SOLDERABLE ELECTRICAL CONDUCTORS

FIELD OF THE INVENTION

The present invention is directed to a solderable aluminum-tin paste composition and solderable aluminum-tin conductors, particularly electrodes, formed from the composition. It is further directed to a silicon semiconductor device and, in particular, it pertains to the electroconductive composition used in the formation of a solderable aluminum-tin electrode of the back side of a solar cell.

TECHNICAL BACKGROUND OF THE INVENTION

The present invention can be applied to a broad range of electrical devices, although it is especially effective in light-receiving elements such as photodiodes and solar cells. The background of the invention is described below with reference to solar cells as a specific example of the prior art.

A conventional solar cell structure with a p-type base has a negative electrode that is typically on the front side or sun side of the cell and a positive electrode on the back side. Radiation of an appropriate wavelength falling on a p-n junction of a semiconductor substrate serves as a source of external energy to generate hole-electron pairs in the substrate. Because of the potential difference which exists at a p-n junction, holes and electrons move across the junction in opposite directions and thereby give rise to flow of an electric current that is capable of delivering power to an external circuit. Most solar cells are in the form of a silicon wafer that has been metallized, i.e., provided with metal electrodes that are electrically conductive.

Typically thick film pastes are screen printed onto the solar cell substrate and fired to form the electrodes. For example a single crystal or multi-crystalline p-type silicon substrate has an n-type diffusion layer adjacent to the light-receiving front side surface. An insulating anti-reflection coating may be formed on the n-type diffusion layer. As shown in FIG. 1, the semiconductor substrate 101 has electrodes 102 on the front side. These electrodes are typically mainly composed of silver. The back side has a compound electrode comprising electrodes 103 mainly composed of aluminum, as well as electrodes 104 mainly composed of silver or some other solderable material. Although the electrode 103 may contain components other than aluminum, it is aluminum-based and will be referred to herein as an aluminum electrode. When the pastes are fired aluminum diffuses into the silicon substrate 101 to form a back surface field layer 105. The back surface field serves to improve the energy conversion efficiency of the solar cell. The aluminum electrode 103 is not solderable. The solderable Ag-based electrodes 104 are printed in the gaps between areas of the non-solderable aluminum back side electrode. The solderable Ag-based electrodes 104 are necessary to serve as tabbing bus bars to which tabbing ribbons can be soldered. The areas under the tabbing bus bars 104 have no back surface field (BSF), as shown in FIG. 1, which results in up to 0.2% cell efficiency loss compared to a solar cell with a full area of back surface field.

As used herein, "not solderable" and "non-solderable aluminum back side electrode" refer to the typically used aluminum electrode which does not lend itself to soldering with a soldering alloy and heat. Ultrasonic bonding of such an aluminum electrode results in inadequate adhesion of the soldered area to the silicon substrate, thus the designation of "not solderable" and "non-solderable aluminum back side electrode".

In one embodiment, the object of this invention is to provide an aluminum-tin paste that can be used to form a solderable aluminum-tin electrode on the back side of a solar cell to replace the currently used Ag-based electrodes. Upon firing, aluminum from the aluminum-tin paste diffuses into the silicon substrate at the areas of contact with the silicon substrate. This provides a full BSF, thus eliminating a solar cell efficiency loss due to interrupted BSF under the silver-containing electrodes typically used to create back side electrodes. Additionally, such aluminum-tin paste would be a more cost-effective solution due to much lower cost of its components compared to the more expensive Ag-based paste.

In another embodiment, the object of this invention is to provide an aluminum-tin paste that can be used to form a solderable aluminum-tin electrode on the entire back side of a solar cell and thereby eliminate the need for the typically used compound back side electrode described above. This would eliminate the additional printing and drying steps as well as the cost of the more expensive Ag-based paste associated with the compound back side electrode.

In still another embodiment, the object of this invention is to provide an aluminum-tin paste that can be used to form a solderable aluminum-tin electrode on selected portions of an aluminum electrode that covers the entire back side of a solar cell.

SUMMARY OF THE INVENTION

The present invention provides a paste composition comprising:
 (a) 10-70 wt % aluminum powder having aluminum particles of particle size in the range of 0.5-10 μm;
 (b) 5-85 wt % tin powder having tin particles of particle size in the range of 1-200 μm; and
 (c) organic medium with 0.1-5 wt % polymer binder;
wherein the aluminum powder and the tin powder are dispersed in the organic medium and wherein the wt % are based on the total weight of the paste composition.

In one embodiment, the invention provides a paste composition for forming a solderable back side electrode, the paste composition comprising:
 (a) 15-50 wt % aluminum powder having aluminum particles of particle size in the range of 0.5-10 μm;
 (b) 35-80 wt % tin powder having tin particles of particle size in the range of 10-200 μm; and
 (c) organic medium with 0.1-5 wt % polymer binder;
wherein the aluminum powder and the tin powder are dispersed in the organic medium and wherein the wt % are based on the total weight of the paste composition.

In another embodiment, the invention provides a paste composition for forming a solderable back side electrode, the paste composition comprising:
 (a) 10-25 wt % aluminum powder having aluminum particles of particle size in the range of 0.5-10 μm;
 (b) 65-85 wt % tin powder having tin particles of particle size in the range of 1-10 μm; and
 (c) organic medium with 0.1-5 wt % polymer binder;
wherein the aluminum powder and the tin powder are dispersed in the organic medium and wherein the wt % are based on the total weight of the paste composition.

In one embodiment, the paste composition further comprises 1-10 wt % silicon powder having silicon particles of particle size in the range of 0.5-60 μm.

In another embodiment, the paste composition further comprises 0.5-6 wt % glass frit.

The invention also provides a solar cell comprising:
(a) a non-solderable aluminum back side electrode containing gaps between areas of the non-solderable aluminum back side electrode; and
(b) a solderable aluminum-tin back side electrode obtained by firing a solderable aluminum-tin back side paste printed as tabbing bus bars in the gaps between areas of the non-solderable aluminum back side electrode.

In one such embodiment of the solar cell, the solderable aluminum-tin back side paste comprises:
(1) 15-50 wt % aluminum powder having aluminum particles of particle size in the range of 0.5-10 μm;
(2) 35-80 wt % tin powder having tin particles of particle size in the range of 10-200 μm; and
(3) organic medium with 0.1-5 wt % polymer binder;
wherein the aluminum powder and the tin powder are dispersed in the organic medium and wherein the wt % are based on the total weight of the paste composition.

In another such embodiment of the solar cell, the solderable aluminum-tin back side paste comprises:
(1) 10-25 wt % aluminum powder having aluminum particles of particle size in the range of 0,5-10 μm;
(2) 65-85 wt % tin powder having tin particles of particle size in the range of 1-10 μm; and
(3) organic medium with 0.1-5 wt % polymer binder;
wherein the aluminum powder and the tin powder are dispersed in the organic medium and wherein the wt % are based on the total weight of the paste composition.

The invention further provides a solar cell comprising:
a solderable aluminum-tin back side electrode obtained by firing a solderable aluminum-tin back side paste covering the entire back surface of the solar cell.

In one such embodiment of the solar cell, the solderable aluminum-tin back side paste comprises:
(1) 15-50 wt % aluminum powder having aluminum particles of particle size in the range of 0.5-10 μm;
(2) 35-80 wt % tin powder having tin particles of particle size in the range of 10-200 μm; and
(3) organic medium with 0.1-5 wt % polymer binder;
wherein the aluminum powder and the tin powder are dispersed in the organic medium and wherein the wt % are based on the total weight of the paste composition.

In another such embodiment of the solar cell, the solderable aluminum-tin back side paste comprises:
(1) 10-25 wt % aluminum powder having aluminum particles of particle size in the range of 0.5-10 μm;
(2) 65-85 wt % tin powder having tin particles of particle size in the range of 1-10 μm; and
(3) organic medium with 0.1-5 wt % polymer binder;
wherein the aluminum powder and the tin powder are dispersed in the organic medium and wherein the wt % are based on the total weight of the paste composition.

The invention also provides a solar cell comprising:
(1) a non-solderable aluminum back side electrode covering the entire back side of the solar cell; and
(2) a solderable aluminum-tin back side electrode obtained by firing a solderable aluminum-tin back side paste printed as tabbing bus bars on portions of the non-solderable aluminum back side electrode.

In one such embodiment of the solar cell, the solderable aluminum-tin back side paste comprises:
(a) 15-50 wt % aluminum powder having aluminum particles of particle size in the range of 0,5-10 μm;
(b) 35-80 wt % tin powder having tin particles of particle size in the range of 10-200 μm; and
(c) organic medium with 0.1-5 wt % polymer binder;
wherein the aluminum powder and the tin powder are dispersed in the organic medium and wherein the wt % are based on the total weight of the paste composition.

In another such embodiment of the solar cell, the solderable aluminum-tin back side paste comprises:
(a) 10-25 wt % aluminum powder having aluminum particles of particle size in the range of 0.5-10 μm;
(b) 65-85 wt % tin powder having tin particles of particle size in the range of 1-10 μm; and
(c) organic medium with 0.1-5 wt % polymer binder;
wherein the aluminum powder and the tin powder are dispersed in the organic medium and wherein the wt % are based on the total weight of the paste composition,

DETAILED DESCRIPTION OF THE INVENTION

Figure 1:
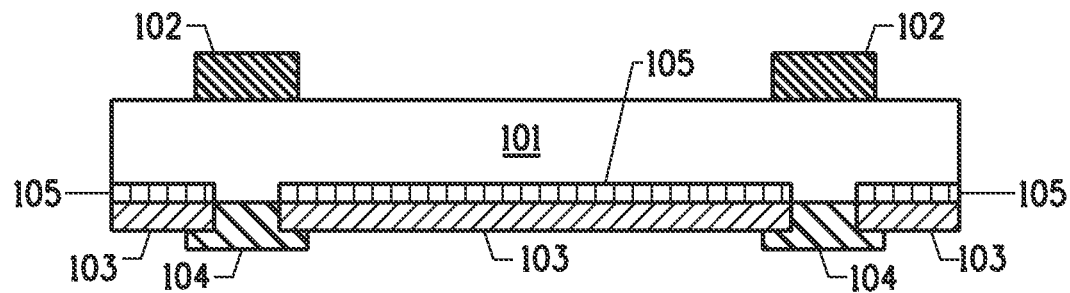
FIG. 1 illustrates the electrode configuration of a solar cell having a non-solderable aluminum back side electrode (obtained by firing back side non-solderable aluminum paste) and a silver or silver/aluminum back side electrode (obtained by firing back side silver or silver/aluminum paste).

The conductive solderable paste composition of the instant invention provides the ability to replace the usually used Ag-based paste on the back side of the solar with the less expensive paste of the invention. It results in a full area of back side field and an increase in solar cell efficiency of up to 0.2%. In another embodiment, the conductive solderable paste composition of the instant invention provides the ability to form a solderable back side electrode from the paste wherein the electrode results in (1) a full area of back side field and an increase in solar cell efficiency of up to 0.2% and (2) elimination of the extra process step and cost of separate formation of tabbing bus bars.

The conductive thick film paste composition of the invention comprises aluminum powder, tin powder and an organic vehicle. It is used to form screen printed electrodes and, particularly, to form electrodes on the back side on the silicon substrate of a solar cell. The paste composition comprises 10-70 wt % aluminum powder having aluminum particles of particle size in the range of 0.5-10 μm, 5-85 wt % tin powder having tin particles of particle size in the range of 1-200 μm; and organic medium with 0.1-5 wt % polymer binder, wherein the aluminum powder and the tin powder are dispersed in the organic medium and wherein the wt % are based on the total weight of the paste composition. In one embodiment, the paste composition comprises 15-50 wt % aluminum powder having aluminum particles of particle size in the range of 0.5-10 μm and 35-80 wt % tin powder having tin particles of particle size in the range of 10-200 μm. In another embodiment, the paste composition comprises 10-25 wt % aluminum powder having aluminum particles of particle size in the range of 0.5-10 μm and 65-85 wt % tin powder having tin particles of particle size in the range of 10-200 μm.

In one embodiment, the paste composition further comprises 1-10 wt % silicon powder having silicon particles of particle size in the range of 0.01-60 μm. In another embodiment, the paste composition further comprises 0.1-1 wt % glass frit.

Each component of the paste composition of the present invention is discussed in detail below.

Aluminum Powder

The instant paste composition comprises 10-70 wt % aluminum powder, based on the total weight of the paste. In one embodiment, the paste composition for forming a solderable back side electrode comprises 15-50 wt % aluminum powder. In one such embodiment, the paste composition comprises 30-45 wt % aluminum powder. In another embodiment, the paste composition for forming a solderable back side electrode comprises 10-25 wt % aluminum powder. In one such embodiment, the paste composition comprises 15-20 wt % aluminum powder. Herein weight percent is abbreviated as wt %.

The aluminum powder may be comprised of particles of various shapes, e.g., a flake form, a spherical form, a granular form, a crystalline form, other irregular forms and mixtures thereof. The particle size of the aluminum particles is in the range of 0.5-10 μm. In one embodiment the particle size of the aluminum particles is in the range of 0.5-3 μm. In another embodiment the particle size of the aluminum particles is in the range of 6-9 μm.

Tin Powder

The instant composition is comprised of 5-85 wt % tin powder, based on the total weight of the paste. In one embodiment, the paste composition for forming a solderable back side electrode comprises 35-80 wt % tin powder. In one such embodiment, the paste composition comprises 40-75 wt % tin powder and in another such embodiment he paste composition comprises 40-60 wt % tin powder. In another embodiment, the paste composition for forming a solderable back side electrode comprises 65-85 wt % tin powder. In one such embodiment, the paste composition comprises 65-75 wt % tin powder.

The tin powder may be comprised of particles of various shapes, e.g., a flake form, a spherical form, a granular form, a crystalline form, other irregular forms and mixtures thereof. The particle size of the tin particles is in the range of 1-200 μm. In one embodiment the particle size of the tin particles is in the range of 10-200 μm. In one such embodiment the particle size of the tin particles is in the range of 10-150 μm. In another embodiment the particle size of the tin particles is in the range of 1-10 μm. In one such embodiment the particle size of the tin particles is in the range of 3-10 μm.

Organic Medium

The inorganic components of the thick film paste composition are mixed with an organic medium to form viscous pastes having suitable consistency and rheology for printing. A wide variety of inert viscous materials can be used as the organic medium. The organic medium can be one in which the inorganic components are dispersible with an adequate degree of stability during manufacturing, shipping and storage of the pastes, as well as on the printing screen during the screen-printing process.

Suitable organic media have rheological properties that provide stable dispersion of solids, appropriate viscosity and thixotropy for screen printing, appropriate wettability of the substrate and the paste solids, a good drying rate, and good firing properties. The organic medium can contain thickeners, stabilizers, surfactants, and/or other common additives. One such thixotropic thickener is thixatrol. The organic medium can be a solution of polymer(s) in solvent(s). Suitable polymers include ethyl cellulose, ethylhydroxyethyl cellulose, wood rosin, mixtures of ethyl cellulose and phenolic resins, polymethacrylates of lower alcohols, and the monobutyl ether of ethylene glycol monoacetate. Suitable solvents include terpenes such as alpha- or beta-terpineol or mixtures thereof with other solvents such as kerosene, dibutylphthalate, butyl carbitol, butyl carbitol acetate, hexylene glycol and alcohols with boiling points above 150° C., and alcohol esters. Other suitable organic medium components include bis[2-(2-butoxyethoxy)ethyl] adipate, dibasic esters such as DBE, DBE-2, DBE-3, DBE-4, DBE-5, DBE-6, DBE-9, and DBE 1B, octyl epoxy tallate, isotetradecanol, and pentaerythritol ester of hydrogenated rosin. The organic medium can also comprise volatile liquids to promote rapid hardening after application of the thick-film paste composition on a substrate.

The optimal amount of organic medium in the thick-film paste composition is dependent on the method of applying the paste and the specific organic medium used. The instant thick-film paste composition contains from 10 to 30 wt % of organic medium, based on the total weight of the paste composition.

If the organic medium comprises a polymer, the polymer typically comprises 0.1 to 5 wt %, based on the total weight of the paste composition.

Additives

In some embodiments, the instant paste composition further comprises additives. In one such embodiment, the instant paste composition further comprises 1-10 wt % silicon powder having silicon particles of particle size in the range of 0.5-60 μm. In another embodiment, the instant paste composition further comprises 1-10 wt % silicon powder having silicon particles of particle size in the range of 0.01-0.1 μm.

Other additives include organic fluxes and single metal and/or metal alloy particles (Bi, Mg, Pb, Zn, etc.). Examples of fluxes are rosin-based organics and inorganics such as ZnCl2 and NH4Cl.

Glass Frit

In one embodiment the instant paste composition further comprises 0.1-1 wt % glass frit, wherein the wt % is based on the total weight of the composition. In another embodiment the composition contains 2-5 wt % glass frit, wherein the wt % is based on the total weight of the composition. Various glass frits are useful in forming the instant composition.

Glass compositions, also termed glass frits, are described herein as including percentages of certain components. Specifically, the percentages are the percentages of the components used in the starting material that was subsequently processed as described herein to form a glass composition. Such nomenclature is conventional to one of skill in the art. In other words, the composition contains certain components, and the percentages of those components are expressed as a percentage of the corresponding oxide form. As recognized by one of ordinary skill in the art in glass chemistry, a certain portion of volatile species may be released during the process of making the glass. An example of a volatile species is oxygen. It should also be recognized that while the glass behaves as an amorphous material it will likely contain minor portions of a crystalline material.

The various glass frits may be prepared by mixing the oxides to be incorporated therein (or other materials that decompose into the desired oxides when heated, e.g., fluorides) using techniques understood by one of ordinary skill in the art. Such preparation techniques may involve heating the mixture in air or an oxygen-containing atmosphere to form a melt, quenching the melt, and grinding, miffing, and/or screening the quenched material to provide a powder with the desired particle size. Melting the mixture of oxides to be incorporated therein is typically conducted to a peak temperature of 800 to 1200° C. The molten mixture can be quenched, for example, on a stainless steel platen or between counter-rotating stainless steel rollers to form a platelet. The resulting platelet can be milled to form a powder. Typically, the milled powder has a $d_{50}$ of 0.1 to 3.0 microns. One skilled in the art of producing glass frit may employ alternative synthesis techniques such as but not limited to water quenching, sol-gel, spray pyrolysis, or others appropriate for making powder forms of glass.

The oxide product of the above process is typically essentially an amorphous (non-crystalline) solid material, i.e., a glass. However, in some embodiments the resulting oxide may be amorphous, partially amorphous, partially crystalline, crystalline or combinations thereof. As used herein "glass frit" includes all such products.

Preparation of the Paste Composition

In one embodiment, the paste composition can be prepared by mixing Al powder, Sn powder, and the organic medium and any other components in any order. In some embodiments, the inorganic materials are mixed first, and they are then added to the organic medium. The viscosity can be adjusted, if needed, by the addition of solvents. Mixing methods that provide high shear are useful.

The paste composition can be deposited by screen-printing, plating, extrusion, inkjet, shaped or multiple printing, or ribbons.

In this electrode-forming process, the thick film paste composition is first dried and then heated to remove the organic medium and sinter the inorganic materials. The heating can be carried out in air. This step is commonly referred to as "firing." The firing temperature profile is typically set so as to enable the burnout of organic binder materials from the dried thick film paste composition, as well as any other organic materials present. In one embodiment, the firing temperature is 690 to 820° C. The firing can be conducted in a belt furnace using high transport rates, for example, 100-500 cm/min, with resulting hold-up times of 0.05 to 5 minutes. Multiple temperature zones, for example 3 to 11 zones, can be used to control the desired thermal profile.

Preparation of Solar Cell

An example of one embodiment in which a solar cell is prepared using the paste composition of the present invention as the electrode on the back side of the solar cell in conjunction with a non-solderable aluminum electrode is explained with reference to FIG. 2.

First, a Si substrate 201 with a diffusion layer and an anti-reflection coating is prepared. On the light-receiving front side (surface) of the Si substrate, electrodes 202 typically mainly composed of Ag are formed. On the back side of the substrate, the non-solderable aluminum paste is deposited and dried. There are gaps in the non-solderable aluminum paste to provide access for the tabbing bus bars electrodes. The solderable paste of the invention is then deposited in the gaps in the dried non-solderable aluminum paste and overlaps the non-solderable aluminum paste and then dried. The drying temperature of each paste is preferably 150° C. or lower.

Figure 2:
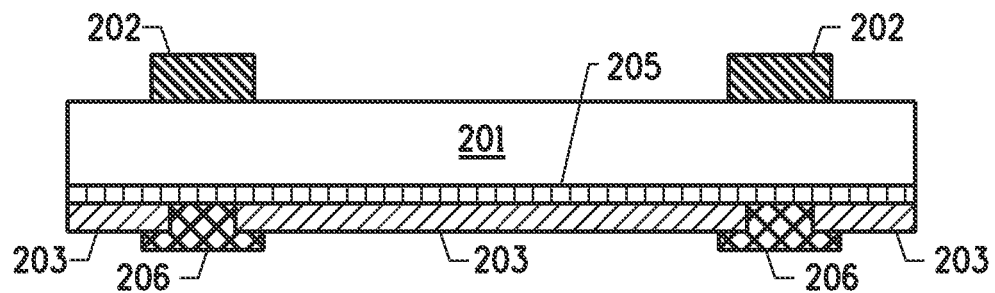
FIG. 2 illustrates the electrode configuration of a solar cell having a non-solderable aluminum back side electrode (obtained by firing back side non-solderable aluminum paste) and a solderable aluminum-tin back side electrode (obtained by firing the solderable back side paste of the invention) printed as tabbing bus bars in gaps between areas of the non-solderable aluminum back side electrode.

Next, the substrate is fired at a temperature of 690-820° C. for about 1-15 min so that the desired solar cell is obtained as shown in FIG. 2. The electrode 206 is formed from the paste composition of the present invention wherein the composition has been fired to remove the organic medium and sinter the inorganics. When the pastes are fired aluminum diffuses into the silicon substrate 201 from both the non-solderable aluminum paste and the solderable paste of the invention to form a full area of back surface field layer 205. The solar cell obtained has electrodes 202 on the light-receiving front side of the substrate 201, and the non-solderable aluminum electrode 203 and the tabbing bus bars electrode 206 formed from the fired paste composition of the present invention on the back face.

An example of another embodiment in which a solar cell is prepared using only the paste composition of the present invention as the electrode on the back side of the solar cell is explained with reference to FIG. 3.

First, a Si substrate 301 with a diffusion layer and an anti-reflection coating is prepared. On the light-receiving front side (surface) of the Si substrate, electrodes 302 typically mainly composed of Ag are formed. On the back face of the substrate, the solderable paste of the invention is then deposited over the entire back surface and then dried. The drying temperature is preferably 150° C. or lower.

Figure 3:
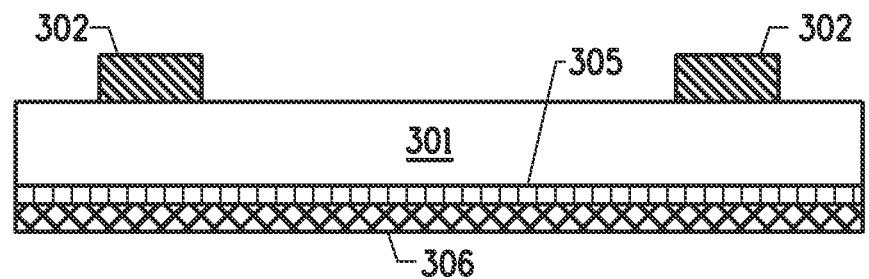
FIG. 3 illustrates the electrode configuration of a solar cell having a back side electrode consisting of a solderable aluminum-tin back side electrode (obtained by firing the solderable back side paste of the invention) covering the entire back side of the solar cell.

Next, the substrate is fired at a temperature of 690-820° C. for about 1-15 min so that the desired solar cell is obtained as shown in FIG. 3. The electrode 306 is formed from the paste composition of the present invention wherein the composition has been fired to remove the organic medium and sinter the inorganics. When the pastes are fired aluminum diffuses into the silicon substrate 301 from the solderable paste of the invention to form a full area of back surface field layer 305. The solar cell obtained has electrodes 302 on the light-receiving front side of the substrate 301, and the electrode 306 formed from the fired paste composition of the present invention on the back face.

An example of still another embodiment in which a solar cell is prepared using the paste composition of the present invention as the electrode on the back side of the solar cell in conjunction with a non-solderable aluminum electrode is explained with reference to FIG. 4.

First, a Si substrate 401 with a diffusion layer and an anti-reflection coating is prepared. On the light-receiving front side (surface) of the Si substrate, electrodes 402 typically mainly composed of Ag are formed. On the back side of the substrate, the non-solderable aluminum paste is deposited over the entire surface and dried. The solderable paste of the invention is then deposited in of the dried non-solderable aluminum paste and overlaps the non-solderable aluminum paste and then dried. The drying temperature of each paste is preferably 150° C. or lower. In one embodiment the solderable paste of the invention is deposited over the entire surface of the dried non-solderable aluminum paste.

Figure 4:
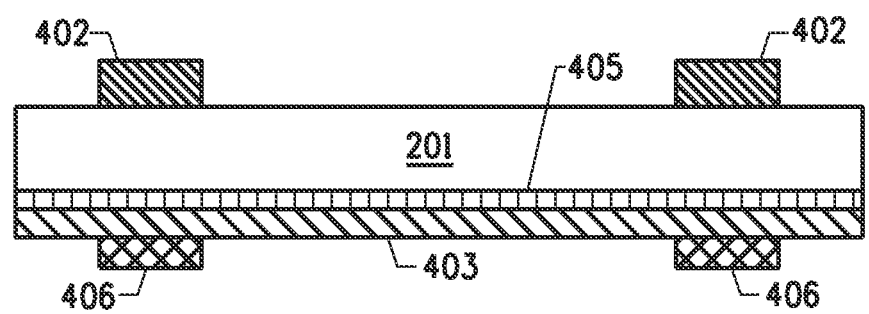
FIG. 4 illustrates the electrode configuration of a solar cell having a back side electrode consisting of a non-solderable aluminum back side electrode (obtained by firing back side non-solderable aluminum paste) covering the entire back side of the solar cell and tabbing bus bars (obtained by firing the solderable back side paste of the invention) on portions of the non-solderable aluminum back side electrode.

Next, the substrate is fired at a temperature of 690-820° C. for about 1-15 min so that the desired solar cell is obtained as shown in FIG. 4. The electrode 406 is formed from the paste composition of the present invention wherein the composition has been fired to remove the organic medium and sinter the inorganics. When the pastes are fired aluminum diffuses into the silicon substrate 401 from the non-solderable aluminum paste to form a full area of back surface field layer 405. The solar cell obtained has electrodes 402 on the light-receiving front side of the substrate 401, and the non-solderable aluminum electrode 403 and the tabbing bus bars electrode 406 formed from the fired paste composition of the present invention on the back face.

Soldering of Tabbing Ribbons

Tabbing ribbons can be soldered to the solderable electrode formed from the solderable paste composition of the invention by soldering the tabbing ribbon to the electrode using a low-melting alloy solder and a soldering iron heated to an appropriate temperature to melt the solder.

Alternatively, tabbing ribbons could be soldered to the solderable electrodes formed from the solderable paste composition of the invention by ultrasonic soldering or ultrasonic welding.

EXAMPLES

Thick Film Paste Composition Preparation

The thick film paste compositions were prepared by combining an aluminum paste precursor comprised of aluminum particles in organic medium (terpineol/ethylcellulose) with additional organic solvent (terpineol) and organic media (terpineol/ethylcellulose) and other paste components according to the desired composition. Tin was added as dry powder. Other components were added to the mixture. Small amounts (up to 100 g) of the thick film paste composition were then homogeneously mixed using a solder paste mixer for about 20 minutes under 500 RPM rotation speed. Large quantities (up to 2 kg) of the thick film paste composition were then homogeneously mixed using a three roll mill (TRM) process. The paste mixture was passed twice through TRM with both gaps set to 10 micron and rollers rotation speed of 120 RPM.

Thick Film Paste Electrode Formation

The thick film paste composition was deposited on the silicon substrate by screen printing, and then dried in a baking oven for 30 min, or a rotisserie type baker for 10 min to remove organic solvent. Drying temperature was varied from 150 to 300° C. 170° C. was identified as the optimal drying temperature.

Two types of screen pattern were used. The paste was printed on the back of a solar cell as shown in FIG. 2 as 2 mm wide bus bars for solar cell properties measurements and adhesion testing. The paste was printed as 2 cm×2 cm square patches for resistivity measurements.

After the drying the substrates with the printed paste pattern were fired in a belt furnace with residence time of about 5 min and a peak firing temperature of 690-820° C. 720° C. was identified as the optimal peak firing temperature.

Soldering of the tabbing ribbons to the tabbing bus bars was done by first depositing liquid rosin flux on the bus bar with a Q-tip followed by aligning of a tabbing ribbon along the bus bar and manual soldering of the tabbing ribbon to the tabbing bus bar with a solder alloy and a soldering iron heated to an appropriate temperature. For example, a soldering iron heated to 275° C. can be used with a 46Bi/34Sn/20Pb alloy solder. Other solder compositions and corresponding solder iron temperatures can be used. Multiple soldering iron swipes (3 to 5) were applied along the surface of the tabbing ribbon to achieve attachment of the tabbing ribbon to the tabbing bus bar.

Thick Film Paste Electrode Characterization

Solar cell performance was measured using an IV tester.

Adhesion data were obtained by using an auto force gauge adhesion tester with horizontal 180 degree angle pulling.

Paste layer thickness was obtained by cross-sectional scanning electron microscopy (SEM) analysis of a fired paste layer.

Resistivity data were calculated by multiplying a paste layer thickness and sheet resistance value obtained by a four point probe measurement on the fired paste patches.

Examples 1-3

Small batches of aluminum-tin solderable pastes of three different compositions were prepared by mixing in a solder paste mixer aluminum paste precursor with 1-2 µm aluminum particles (Du Pont Co., Wilmington, Del.) in organic medium (terpineol/ethylcellulose), tin powder with −100 mesh particles (VWR International, LLC, Radnor, Pa.), i.e., 90% or more of the particles pass through a 100 mesh sieve which means that 90% or more of the particles are smaller than 149 µm, and organic medium of terpineol/ethyl cellulose. The final paste compositions are shown in the Table 1.

TABLE 1

| | Al, wt. % | Ethyl Cellulose, wt. % | Tin, wt. % | Tin type |
|---|---|---|---|---|
| Example 1 | 18 | 0.35 | 70 | −100 mesh |
| Example 2 | 35 | 0.5 | 50 | −100 mesh |
| Example 3 | 44 | 0.6 | 40 | −100 mesh |

The pastes IV performance, solderability and adhesion were evaluated in solar cells where the pastes were printed as tabbing bus bars in the gaps between aluminum electrode areas. For comparison, solar cells with standard silver-containing tabbing bus bars were prepared as reference cells. All solar cells were screen printed, dried in a rotisserie type baker at 170° C. for about 10 min, and fired on belt furnace at a peak firing temperature of 720° C. Solar cell performance was evaluated with an IV tester. IV tested cells then went through the soldering process in which 1.5 mm wide copper ribbon coated with a low-melting temperature 46Bi/34Sn/20Pb alloy solder was attached to the tabbing bus bars using a soldering iron heated to 275° C. The tabbing bus bars formed from the pastes of all three Examples were solderable.

It was found that the paste of Example 2 demonstrated the best IV performance compared to the tabbing pastes of Examples 1 and 3 and the silver-containing tabbing paste. It had a 0.2% efficiency increase compared to the conventional Ag-containing tabbing paste. The paste of Example 1 with the highest tin content of 70 wt % did not show any Voc boost compared to the conventional Ag-containing tabbing paste. Cross-sectional SEM analysis of the substrates with the printed and fired paste patches showed a good uniform BSF layer formation for the pastes of Examples 2 and 3 with lower tin content, while the BSF layer of the paste of Example 1 with high tin content of 70 wt % was less uniform and gaps in the BSF layer were observed. Such non-uniform BSF layer formation for the paste of Example 1 is believed to be the reason for the lower Voc compared to the pastes with tin content of 50 wt % and below.

The paste of Example 2 also demonstrated better adhesion compared to the paste of Example 1 and better to comparable adhesion compared to the paste of Example 3. The electrodes formed from all 3 pastes of the Examples had lower adhesion than that of the conventional silver-containing tabbing paste.

The resistivity of the pastes was evaluated for fired paste patches printed on silicon substrates, and dried and fired under identical conditions. Resistivity measurements showed that the pastes of Examples 2 and 3 have resistivity acceptable for tabbing paste requirements while that of Example 1 was somewhat higher.

Examples 4-7

To evaluate the effect of tin particle size on the paste performance four other small batches of aluminum-tin pastes comparable in composition to the compositions of Examples 1 and 2 were prepared by mixing in a solder paste mixer of aluminum paste precursor with 1-2 μm aluminum particles, tin powders with particle size 5 μm (Examples 4 and 5) and 1-5 μm (Examples 6 and 7), and organic media terpineol/ethyl. The final paste compositions are shown in the Table 2.

TABLE 2

|  | Al, wt. % | Ethyl Cellulose, wt. % | Tin, wt. % | Tin type |
| --- | --- | --- | --- | --- |
| Example 4 | 18 | 0.35 | 70 | 5 μm |
| Example 5 | 35 | 0.5 | 50 | 5 μm |
| Example 6 | 17 | 0.8 | 70 | 1-5 μm |
| Example 7 | 33.5 | 1.0 | 50 | 1-5 μm |

All the pastes were printed, dried and fired under conditions identical to the conditions described above for the pastes of Examples 1-3, Only the tabbing bus bar formed from the paste of Example 4 was solderable using the technique described for Examples 1-3.

It was demonstrated that a solar cell performance strongly depends on a tin content in the paste, while tin particle size play lesser role. All the pastes with 50 wt % tin content show Voc boost compare to Ag-paste resulting in a solar cell efficiency increase by up to 0.15% to 0.2%, while the pastes with 70 wt % or more of tin demonstrate comparable to lower Voc versus Ag-paste. The pastes with the smallest tin particle size, i.e., 1-5 μm, show higher Voc in all cases compared to the pastes with larger tin particle size.

Resistivity evaluation for the fired patches of the pastes of the Examples showed that the pastes of Examples 6 and 7 with smallest tin particle size (1-5 μm) have highest conductivity. The pastes of Examples 1-3 with largest tin particles size (–100 mesh) show good conductivity, acceptable for tabbing application. The paste of Example 4 with intermediate tin particle size (5 μm) and 50 wt % tin has good conductivity, while the paste of Example 5 with intermediate tin particle size (5 μm) and 70 wt % tin has low conductivity. For pastes with the same size tin particles, paste with 50 wt % tin has higher conductivity than that with 70 wt % tin.

What is claimed is:
1. A paste composition consisting of:
    (a) 10-70 wt % aluminum powder having aluminum particles of particle size in the range of 0.5-10 μm;
    (b) 5-85 wt % tin powder having tin particles of particle size in the range of 1-200 μm; and
    (c) organic medium with 0.1-5 wt % polymer binder;
wherein said aluminum powder and said tin powder are dispersed in the organic medium and wherein the wt % are based on the total weight of said paste composition.

2. The paste composition of claim 1, said paste composition consisting of:
    (a) 15-50 wt % aluminum powder having aluminum particles of particle size in the range of 0.5-10 μm;
    (b) 35-80 wt % tin powder having tin particles of particle size in the range of 10-200 μm; and
    (c) organic medium with 0.1-5 wt % polymer binder;
wherein said aluminum powder and said tin powder are dispersed in said organic medium and wherein the wt % are based on the total weight of said paste composition.

3. The paste composition of claim 2, said tin powder having tin particles of particle size in the range of 10-150 μm.

4. The paste composition of claim 1, said paste composition consisting of:
    (a) 10-25 wt % aluminum powder having aluminum particles of particle size in the range of 0.5-10μm;
    (b) 65-85 wt % tin powder having tin particles of particle size in the range of 1-10 μm; and
    (c) organic medium with 0.1-5 wt % polymer binder;
wherein said aluminum powder and said tin powder are dispersed in said organic medium and wherein the wt % are based on the total weight of said paste composition.

5. The paste composition of claim 4, said tin powder having tin particles of particle size in the range of 3-10 μm.

6. A solar cell comprising:
    (a) a non-solderable aluminum back side electrode containing gaps between areas of the non-solderable aluminum back side electrode; and
    (b) a solderable aluminum-tin back side electrode obtained by firing a solderable aluminum-tin back side paste deposited as tabbing bus bars in the gaps between areas of the non-solderable aluminum back side electrode, said solderable aluminum-tin back side paste consisting of:
        (1) 10-70 wt % aluminum powder having aluminum particles of particle size in the range of 0.5-10 μm;
        (2) 5-85 wt % tin powder having tin particles of particle size in the range of 1-200 μm; and
        (3) organic medium with 0.1-5 wt % polymer binder;
    wherein the aluminum powder and the tin powder are dispersed in the organic medium and wherein the wt % are based on the total weight of the paste composition.

7. The solar cell of claim 6, said tin powder having tin particles of particle size in the range of 10-150 μm.

8. A solar cell containing a front surface and a back surface, said solar cell comprising:
    a solderable aluminum-tin back side electrode obtained by firing a solderable aluminum-tin back side paste covering the entire back side surface of said solar cell, said solderable aluminum-tin back side paste consisting of:
        (1) 10-70 wt % aluminum powder having aluminum particles of particle size in the range of 0.5-10 μm;
        (2) 5-85 wt % tin powder having tin particles of particle size in the range of 1-200 μm; and
        (3) organic medium with 0.1-5 wt % polymer binder;
    wherein the aluminum powder and the tin powder are dispersed in the organic medium and wherein the wt % are based on the total weight of the paste composition.

9. A solar cell containing a front surface and a back surface, said solar cell comprising:
    (a) non-solderable aluminum back side electrode covering the entire back side surface; and (b) a solderable aluminum-tin back side electrode obtained by firing a solderable aluminum-tin back side paste deposited on portions of the non-solderable aluminum back side electrode, said solderable aluminum-tin back side paste consisting of:
  (1) 10-25 wt % aluminum powder having aluminum particles of particle size in the range of 0.5-10 μm;
  (2) 65-85 wt % tin powder having tin particles of particle size in the range of 1-10 μm; and
  (3) organic medium with 0.1-5 wt % polymer binder; wherein the aluminum powder and the tin powder are dispersed in the organic medium and wherein the wt % are based on the total weight of the paste composition.

10. The solar cell of claim 9, said tin powder having tin particles of particle size in the range of 3-10 μm.

* * * * *